(12) United States Patent
Mitsui et al.

(10) Patent No.: US 12,206,401 B2
(45) Date of Patent: Jan. 21, 2025

(54) DRIVE DEVICE TO DRIVE SEMICONDUCTOR ELEMENT, SEMICONDUCTOR DEVICE, AND POWER CONVERSION DEVICE

(71) Applicant: Mitsubishi Electric Corporation, Tokyo (JP)

(72) Inventors: Yohei Mitsui, Tokyo (JP); Yasutaka Imamura, Tokyo (JP); Takeshi Horiguchi, Tokyo (JP); Yasushige Mukunoki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 42 days.

(21) Appl. No.: 18/015,720

(22) PCT Filed: Sep. 7, 2020

(86) PCT No.: PCT/JP2020/033793
§ 371 (c)(1),
(2) Date: Jan. 12, 2023

(87) PCT Pub. No.: WO2022/049772
PCT Pub. Date: Mar. 10, 2022

(65) Prior Publication Data
US 2023/0261654 A1      Aug. 17, 2023

(51) Int. Cl.
*H03K 17/687* (2006.01)
*H03K 17/06* (2006.01)
*H03K 17/0812* (2006.01)

(52) U.S. Cl.
CPC ....... *H03K 17/6871* (2013.01); *H03K 17/063* (2013.01); *H03K 17/08122* (2013.01)

(58) Field of Classification Search
None
See application file for complete search history.

(56) References Cited

U.S. PATENT DOCUMENTS

| | | | | |
|---|---|---|---|---|
| 5,210,479 A | * | 5/1993 | Kimura | H02P 27/08 361/93.7 |
| 7,295,412 B2 | * | 11/2007 | Sasaki | B60K 6/485 361/91.1 |

(Continued)

FOREIGN PATENT DOCUMENTS

| JP | 2007-174134 A | 7/2007 |
|---|---|---|
| JP | 2015-53749 A | 3/2015 |

OTHER PUBLICATIONS

International Search Report and Written Opinion mailed on Oct. 27, 2020, received for PCT Application PCT/JP2020/033793, filed on Sep. 7, 2020, 8 pages including English Translation.

*Primary Examiner* — Thomas J. Hiltunen
(74) *Attorney, Agent, or Firm* — XSENSUS LLP

(57) ABSTRACT

A semiconductor device includes a power switching element and a drive device to drive the power switching element. The drive device includes a voltage source, a switching element, a capacitor connected in parallel to the voltage source with the switching element being interposed, a switching element provided between the capacitor and a gate terminal of the power switching element, a first comparison device to output a result of comparison between a voltage of the capacitor and a reference value VQR, a second comparison device to output a result of comparison between a gate voltage of the power switching element and a reference value VR, and a short-circuit determination unit that makes determination as to a short circuit of the power switching element based on an output signal from the first comparison device and an output signal from the second comparison device.

10 Claims, 12 Drawing Sheets

(56) References Cited

U.S. PATENT DOCUMENTS

| | | | | |
|---|---|---|---|---|
| 11,050,418 B2* | 6/2021 | Bachhuber | ......... | H03K 17/0828 |
| 11,519,954 B2* | 12/2022 | Gunasekaran | ..... | G01R 31/3277 |
| 2011/0169470 A1* | 7/2011 | Itakura | .................... | H02M 1/32 |
| | | | | 323/282 |
| 2022/0321116 A1* | 10/2022 | Niikura | .............. | H03K 17/0822 |
| 2023/0286384 A1* | 9/2023 | Ozguc | ...................... | H02H 7/18 |

* cited by examiner

DRIVE DEVICE TO DRIVE SEMICONDUCTOR ELEMENT, SEMICONDUCTOR DEVICE, AND POWER CONVERSION DEVICE

CROSS-REFERENCE TO RELATED APPLICATION

The present application is based on PCT filing PCT/JP2020/033793, filed Sep. 7, 2020, the entire contents of which are incorporated herein by reference.

TECHNICAL FIELD

The present disclosure relates to a drive device to drive a semiconductor element, and a semiconductor device and a power conversion device including the semiconductor element and the drive device.

BACKGROUND ART

An insulated gate bipolar transistor (IGBT) composed of silicon (Si) is often employed as a power semiconductor element included in a power converter. In recent years, for further reduction in size and further higher efficiency of the power converter, a metal oxide semiconductor field effect transistor (MOSFET) composed of silicon carbide (SiC) has more increasingly been applied.

When a short circuit in a power semiconductor element occurs in a power converter, a high current flows while a direct-current (DC) link voltage of the power converter is applied to the power semiconductor element and tremendous energy loss (heat) may be generated. Therefore, in order to ensure reliability of the power converter, desirably, a circuit to detect a short-circuited state of the power semiconductor element is provided.

Some of conventional drive devices to drive a power semiconductor element include a device to detect an amount of gate charges supplied to a gate of the power semiconductor element and a device to detect a gate voltage of the power semiconductor element as means for quickly detecting a short-circuited state of the power semiconductor element (for example, PTL 1).

CITATION LIST

Patent Literature

PTL1: Japanese Patent Laying-Open No. 2015-53749

SUMMARY OF INVENTION

Technical Problem

The drive device described in Japanese Patent Laying-Open No. 2015-53749 (PTL 1) requires a detection device to detect an amount of gate charges for detecting a short-circuited state by making use of the fact that relation between an amount of gate charges and a gate voltage is different between a short-circuited state and a normal state. This detection device detects a gate current by monitoring an output from a current sensor and a voltage across a gate resistor, and detects the amount of gate charges by integrating the detected gate currents. Therefore, the drive device requires an integrator, which disadvantageously makes a circuit scale higher.

The present disclosure was made to solve the problem described above, and an object thereof is to enable determination as to a short circuit of a power semiconductor element with a simplified circuit without the use of an integrator.

Solution to Problem

A drive device according to the present disclosure is a drive device to drive a power semiconductor element including a gate terminal, and includes a first voltage source, a switching element, a capacitor connected in parallel to the first voltage source with the switching element being interposed, a switching device provided between the capacitor and the gate terminal of the semiconductor element and configured to switch a voltage applied to the gate terminal, a first comparison device to output a signal indicating a result of comparison between a voltage of the capacitor and a first reference value, a second comparison device to output a signal indicating a result of comparison between a voltage or a derivative value of the voltage at the gate terminal and a second reference value, and a determination unit to determine whether the semiconductor element is in a short-circuited state based on an output signal from the first comparison device and an output signal from the second comparison device.

In the drive device, determination as to a short circuit of the semiconductor element is made not based on a result of direct detection of an amount of gate charges, but based on monitoring of a voltage of the capacitor and a gate voltage of the switching element or a derivative value thereof. Therefore, determination as to a short circuit of the semiconductor element can be made with a simplified circuit without the use of an integrator to detect the amount of gate charges.

Advantageous Effects of Invention

According to the present disclosure, determination as to a short circuit of a power semiconductor element can be made with a simplified circuit without the use of an integrator.

DESCRIPTION OF EMBODIMENTS

Figure 1:
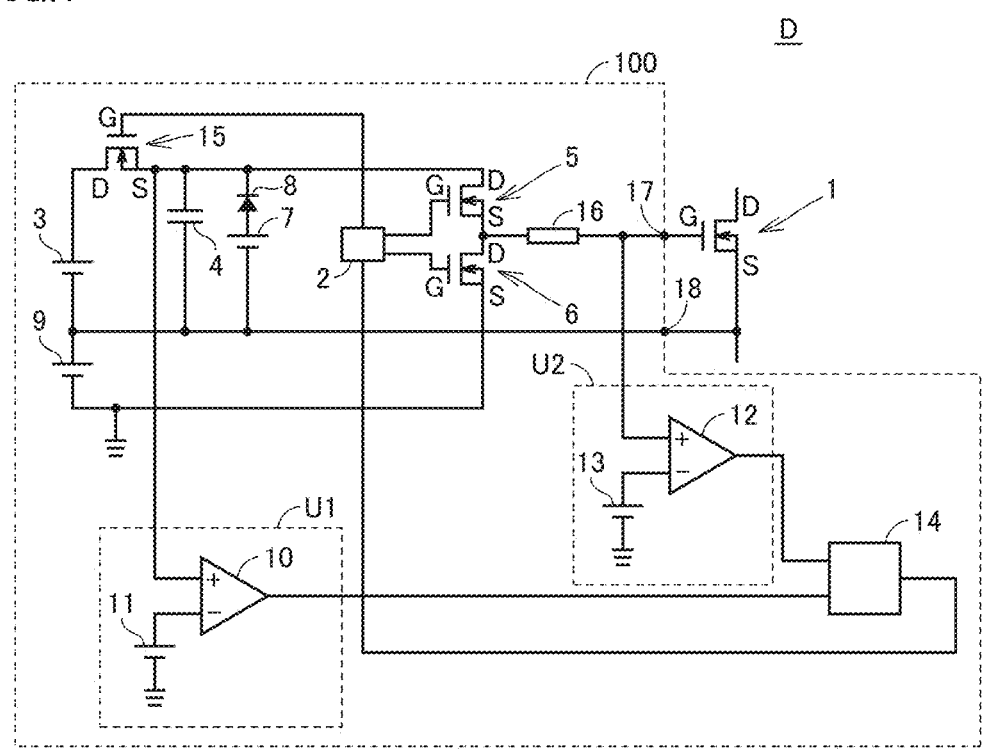
FIG. 1 is a diagram (No. 1) showing an exemplary semiconductor device.

An embodiment of the present disclosure will be described in detail below with reference to the drawings. The same or corresponding elements in the drawings have the same reference characters allotted and description thereof will not be repeated.

First Embodiment

FIG. 1 is a diagram showing an exemplary semiconductor device D including a drive device 100 according to the present first embodiment. Semiconductor device D includes a switching element 1 which is a power semiconductor element and drive device 100 to drive switching element 1.

In the present first embodiment, an example in which switching element 1 is implemented by a MOSFET will be described. In general, the MOSFET is configured to be in an off-state (a blocking state) where no drain current (a current that flows between a source and a drain) is produced when a gate voltage (a voltage between a gate and the source) is lower than a threshold voltage and to be in an on-state (a conducting state) where the drain current is produced when the gate voltage is equal to or higher than the threshold voltage.

Each of switching elements 5, 6, 15, and 50 which will be described below is also implemented by a MOSFET, similar to switching element 1. Switching element 1 and switching elements 5, 6, 15, and 50 are not limited to the MOSFETs, but may each be implemented, for example, by a voltage-driven semiconductor element such as an IGBT, The IGBT may be a reverse-conducting IGBT (RC-IGBT).

Switching elements 1, 5, 6, and 15 are applicable to a device composed of any of silicon (Si), silicon carbide (SiC), gallium nitride (GaN), and gallium oxide ($Ga_2O_3$).

Drive device 100 includes an instruction unit a 2, voltage sources 3, 7, and 9, a capacitor 4, switching elements 5, 6, and 15, a diode 8, a pair of output terminals 17 and 18, a first comparison device U1, a second comparison device U2, a short-circuit determination unit 14, and a gate resistor 16. First comparison device U1 includes a comparison unit 10 and a voltage source 11. Second comparison device U2 includes a comparison unit 12 and a voltage source 13.

Output terminals 17 and 18 are connected to the gate and the source of switching element 1, respectively.

Voltage source 3 is connected to capacitor 4 with switching element 15 being interposed. Specifically, voltage source 3 has a positive electrode connected to one end of capacitor 4 with switching element 15 being interposed and has a negative electrode connected the other end of capacitor 4.

Voltage source 9 is connected in series to voltage source 3. Voltage source 9 has a positive electrode connected to the negative electrode of voltage source 3 and output terminal 18 and has a negative electrode connected to a drain terminal of switching element 6.

Capacitor 4 is connected in parallel to voltage source 3 with switching element 15 being interposed.

Voltage source 7 is connected to one end of capacitor 4 with diode 8 being interposed and supplies a drive voltage Von to one end of capacitor 4. Voltage source 7 and diode 8 stabilize a voltage in a steady on-state of switching element 1 at drive voltage Von.

Switching element 5 is implemented by an N-type MOSFET. Switching element 5 has a source terminal connected to output terminal 17 of drive device 100 with gate resistor 16 being interposed. Gate resistor 16 is a resistor to adjust a switching speed of switching element 5. Switching element 5 has a drain terminal connected to one end of capacitor 4 and connected to the positive electrode of voltage source 3 with switching element 15 being interposed.

Switching element 5 has a gate terminal connected to instruction unit 2 and receives a gate voltage from instruction unit 2. When the gate voltage from instruction unit 2 is applied to the gate terminal of switching element 5, switching element 5 is turned on and one end of capacitor 4 and output terminal 17 are connected to each other. An output voltage from drive device 100 is thus set to the voltage of capacitor 4 (a voltage across terminals of capacitor 4, which is simply also referred to as a "capacitor voltage" below).

Switching element 6 is implemented by an N-type MOSFET similarly to switching element 5. Switching element 6 has a drain terminal connected to output terminal 17 of drive device 100 with gate resistor 16 being interposed. Switching element 6 has a source terminal connected to the negative electrode of voltage source 9.

Switching element 6 has a gate terminal connected to instruction unit 2 and receives a gate voltage from instruction unit 2. When the gate voltage from instruction unit 2 is applied to the gate terminal of switching element 6, switching element 6 is turned on and the negative electrode of voltage source 9 and output terminal 17 are connected to each other. The output voltage is thus set to a negative bias potential Voff supplied by voltage source 9.

Switching elements 5 and 6 are controlled by instruction unit 2 to operate complementarily to each other. Specifically, while switching element 5 is on, switching element 6 is off, and while switching element 5 is off, switching element 6 is on. Thus, drive voltage Von can be applied to the gate terminal of switching element 1 while switching element 1 is in the steady on-state, and negative bias potential Voff can be applied to the gate terminal of switching element 1 while switching element 1 is in a steady off-state.

Instruction unit 2 controls on and off of switching elements 5, 6, and 15 by providing gate voltages to respective switching elements 5, 6, and 15 at timing designated in advance based on an externally provided gate signal. Instruction unit is configured to control on/off of switching element 5, on/off of switching element 6, and on/off of switching element 15, individually.

Switching element 1 switches between on and off states based on a signal from instruction unit 2.

When switching element 1 is to be turned off, instruction unit 2 outputs an off-command to turn on switching element 15, turn off switching element 5, and turn on switching element 6 to switching elements 5, 6, and 15. As switching element 15 is turned on, capacitor 4 is charged by voltage source 3 and the capacitor voltage is an output voltage of voltage source 3. Charges necessary for switching of switching element 1 are thus stored in capacitor 4. As switching element 5 is turned off and switching element 6 is turned on, negative bias potential Voff from voltage source 9 is applied to the gate terminal of switching element 1.

When switching element 1 is changed from off to on, instruction unit 2 disconnects capacitor 4 from voltage source 3 initially by changing switching element 15 from on to off.

Thereafter, instruction unit 2 switches switching element 5 to on and switches switching element 6 to off. The gate terminal of switching element 1 is thus connected to capacitor 4 with gate resistor 16 being interposed. Charges provided to capacitor 4 flow into the gate of switching element 1. With increase in gate voltage of switching element 1, a voltage of capacitor 4 lowers. At this time, by setting an initial value of the capacitor voltage (an output voltage from voltage source 3) to a voltage higher than drive voltage Von (an output voltage from voltage source 7), switching element 1 can be switched faster than drive at a constant voltage at drive voltage Von.

As the capacitor voltage lowers from the initial value to drive voltage Von, diode 8 is rendered conducting and the output voltage becomes constant at drive voltage Von. At this time, the amount of charges that have flowed into the gate of switching element 1 (which is also referred to as an "amount of gate charges" below) from drive device 100 is equal to an amount of charges discharged from capacitor 4. Therefore, a relational expression (1) below is satisfied among "Qg", "Cb", and "ΔV", with "Qg" representing an amount of gate charges, "Cb" representing a capacitance of capacitor 4, and "ΔV" representing an amount of lowering in capacitor voltage.

$$\Delta V \times Cb = Qg \quad (1)$$

In the relational expression (1) above, capacitance Cb of capacitor 4 is determined in advance. Therefore, by detecting the capacitor voltage and finding amount of lowering ΔV in capacitor voltage, amount of gate charges Qg can be detected. Therefore, in detection of amount of gate charges Qg, an operating circuit such as an integration circuit is not required, and amount of gate charges Qg can directly be detected from the capacitor voltage. Therefore, a circuit scale can be small.

First comparison device U1 detects amount of gate charges Qg from the capacitor voltage, by making use of the relational expression (1) above. Specifically, first comparison device U1 includes comparison unit 10 and voltage source 11 as described above. Voltage source 11 outputs a voltage at a reference value VQR to comparison unit 10.

Comparison unit 10 detects amount of gate charges Qg reaching a reference value QR by detecting lowering of the capacitor voltage to reference value VQR based on comparison of the capacitor voltage with a voltage at reference value VQR outputted from voltage source 11.

Comparison unit 10 outputs an output signal S1 indicating a result of comparison between the capacitor voltage and reference value VQR to short-circuit determination unit 14. Comparison unit 10 sets output signal S1 to a low state when the capacitor voltage is equal to or lower than reference value VQR and sets output signal S1 to a high state when the capacitor voltage is higher than reference value VQR.

Second comparison device U2 includes comparison unit 12 and voltage source 13 as described above. Voltage source 13 outputs a voltage at reference value VR to comparison unit 12. Comparison unit 12 detects the gate voltage of switching element 1 reaching reference value VR based on comparison of the gate voltage of switching element 1 (the voltage applied to the gate terminal of switching element 1 by drive device 100) with the voltage at reference value VR outputted from voltage source 13.

Comparison unit 12 outputs an output signal S2 indicating a result of comparison between the gate voltage of switching element 1 and reference value VR to short-circuit determination unit 14. Comparison unit 12 sets output signal S2 to the low state when the gate voltage of switching element 1 is equal to or lower than reference value VR and sets output signal S2 to the high state when the gate voltage of switching element 1 is higher than reference value VR.

Short-circuit determination unit 14 detects a short-circuited state of switching element 1 based on output signal S1 from first comparison device U1 and output signal S2 from second comparison device U2.

[Determination as to Short Circuit of Switching Element 1]

Figure 2:
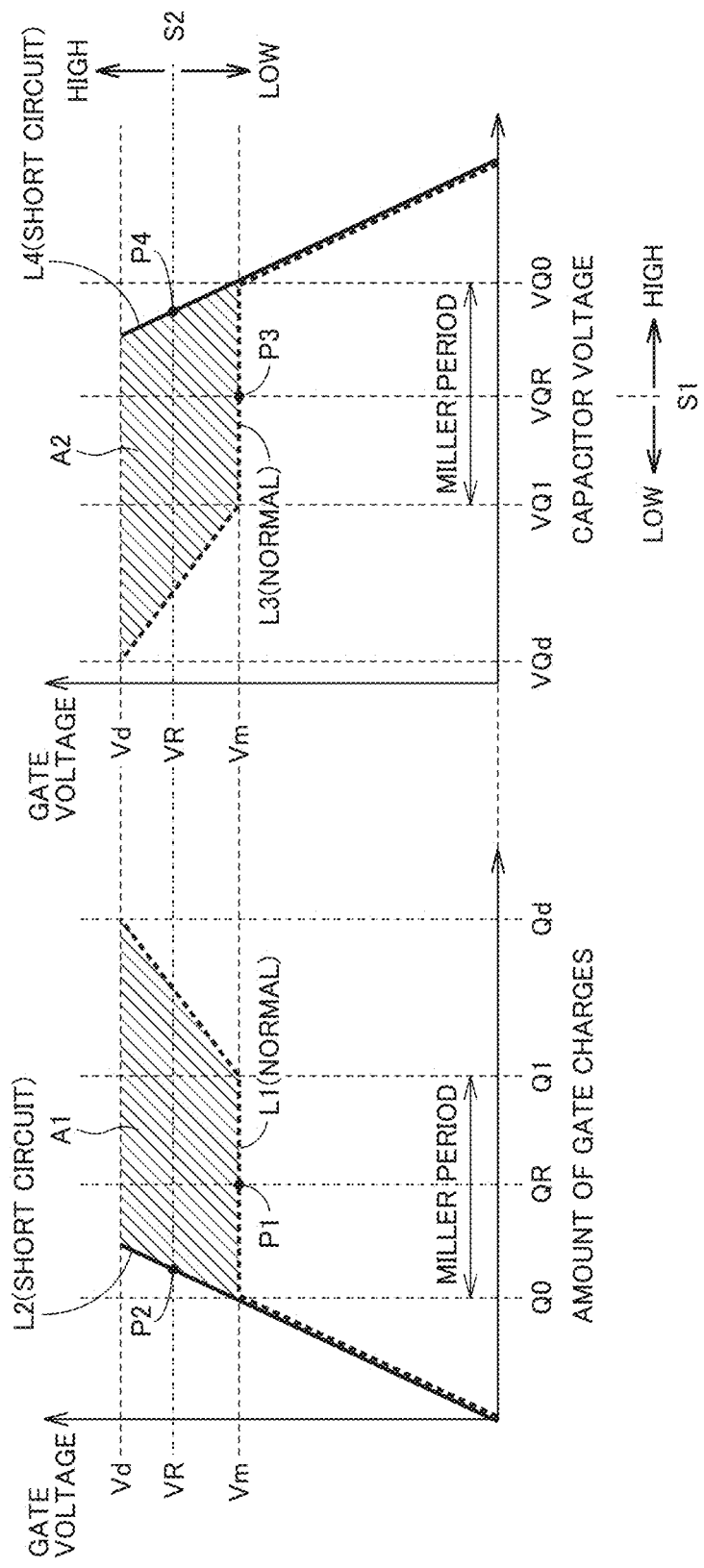
FIG. 2 is a diagram showing relation between an amount of gate charges and a gate voltage and relation between a capacitor voltage and a gate voltage.

FIG. 2 is a diagram showing (on the left) relation between the amount of gate charges and the gate voltage of switching element 1 and showing (on the right) relation between the capacitor voltage and the gate voltage of switching element 1 in a tuna-on operation of switching element 1. In the figure on the left showing relation between the amount of gate charges and the gate voltage, relation in a normal state (a non-short-circuited state) of switching element 1 is shown with a dashed line L1 and relation in arm short circuit of switching element 1 is shown with a solid line L2. In the figure on the right showing relation between the capacitor voltage and the gate voltage, relation in the normal state of switching element 1 is shown with a dashed line L3 and relation in arm short circuit of switching element 1 is shown with a solid line L4.

FIG. 2 illustrates relation in an example where switching element 1 is implemented by a MOSFET composed of silicon carbide (SiC) (which is also referred to as an "SiC-MOSFET" below).

In the normal state of switching element 1, with increase in gate voltage, the amount of gate charges increases and the capacitor voltage lowers. When the gate voltage increases to a voltage Vm, a rate of increase in gate voltage significantly lowers. When the gate voltage reaches voltage Vm, the amount of gate charges is an amount of charges Q0 and the capacitor voltage is a voltage VQ0 (VQ0=Q0/Cb). "Cb" represents a capacitance of capacitor 4 as described above.

Thereafter, when the amount of gate charges reaches an amount of charges Q1 (Q1>Q0), the capacitor voltage is a voltage VQ1 (VQ1=Q1/Cb). During a period until the amount of gate charges reaches amount of charges Q1 from amount of charges Q0, gate voltage increases slowly and remains at a voltage of around Vm. A period until the amount of gate charges reaches amount of charges Q1 from amount of charges Q0 is called a "Miller period."

Thereafter, when the amount of gate charges exceeds amount of charges Q1, the gate voltage again increases to reach a gate drive power supply voltage Vd. Switching element 1 is thus turned on.

A feedback capacitance plays a significant role in the relation between the amount of gate charges and the gate voltage in the SiC-MOSFET such as switching element. The feedback capacitance in the SiC-MOSFET corresponds to a capacitance between the drain and the gate and it is highly voltage-dependent.

In the turn-on operation in the normal state of switching element 1, the gate voltage increases based on a command from instruction unit 2 to charge the switching element across the gate and the source. When the gate voltage exceeds the threshold voltage, the drain current (the current that flows between the source and the drain) starts to flow and the voltage across the drain and the source lowers, and the gate current supplied from drive device 100 to switching element 1 flows from the gate terminal to the drain terminal of switching element 1 through the feedback capacitance. The Miller period during which increase in gate voltage is quite a little thus appears. The feedback capacitance is highly voltage-dependent, and when the voltage across the drain and the source lowers to an on voltage of switching element 1, a value of the feedback capacitance becomes higher by one order to two orders of magnitude. Consequently, the gate voltage increases slowly to gate drive power supply voltage Vd after the end of the Miller period.

In arm short circuit of switching element 1, however, such a Miller period does not appear, and the gate voltage of switching element 1 increases at once to gate drive power supply voltage Vd.

Short-circuit determination unit 14 according to the present embodiment determines whether arm short circuit of switching element 1 has occurred based on the relation shown in FIG. 2. A measure to make determination as to the atm short circuit of switching element 1 will be described below.

In the present embodiment, reference value QR of the amount of gate charges and reference value VR of the gate voltage are set such that reference value QR of the amount of gate charges and reference value VR of the gate voltage are included within a region A1 surrounded by dashed line L1 in the normal state, solid line L2 in the arm short circuit, and gate drive power supply voltage Vd in the relation between the amount of gate charges and the gate voltage shown on the left in FIG. 2. When this is converted to relation between the capacitor voltage and the gate voltage shown on the right in FIG. 2, reference value VQR of the capacitor voltage (the capacitor voltage when the amount of gate charges is reference value QR) and reference value VR of the gate voltage are included in a region A2 surrounded by dashed line L3 in the normal state, solid line L4 in the arm short circuit, and gate drive power supply voltage Vd.

When the amount of gate charges that flow out of capacitor 4 reaches reference value QR in a switching operation of switching element 1, the capacitor voltage lowers to reference value VQR and output signal S1 from first comparison device U1 changes from the high state to the low state.

When output signal S2 from second comparison device U2 changes from the low state to the high state while output signal S1 from first comparison device U1 is in the high state (that is, when the gate voltage reaches reference value VQR while the capacitor voltage is higher than reference value VQR), relation between the capacitor voltage and the gate voltage is considered as being shown with an operation point P4 on solid line L4 in the short circuit without the Miller period (when this relation is converted to relation between the amount of gate charges and the gate voltage, shown with an operation point P2 on solid line L2 in the short circuit without the Miller period). Therefore, short-circuit determination unit 14 determines that switching element 1 is in the short-circuited state and outputs a high signal indicating that switching element 1 is in the short-circuited state to instruction unit 2.

When output signal S1 from first comparison device U1 changes from the high state to the low state while output signal S2 from second comparison device U2 is in the low state (that is, when the capacitor voltage lowers from a value higher than reference value VQR to reference value VQR while the gate voltage is equal to or lower than reference value VR), relation between the capacitor voltage and the gate voltage is considered as being shown with an operation point P3 on dashed line L3 in the normal state with the Miller period (when this relation is converted to relation between the amount of gate charges and the gate voltage, shown with an operation point P1 on solid line L1 in the normal state with the Miller period). Therefore, short-circuit determination unit 14 determines that switching element 1 is in the normal state (not in the short-circuited state) and outputs a low signal indicating that switching element 1 is in the normal state to instruction unit 2.

Figure 3:
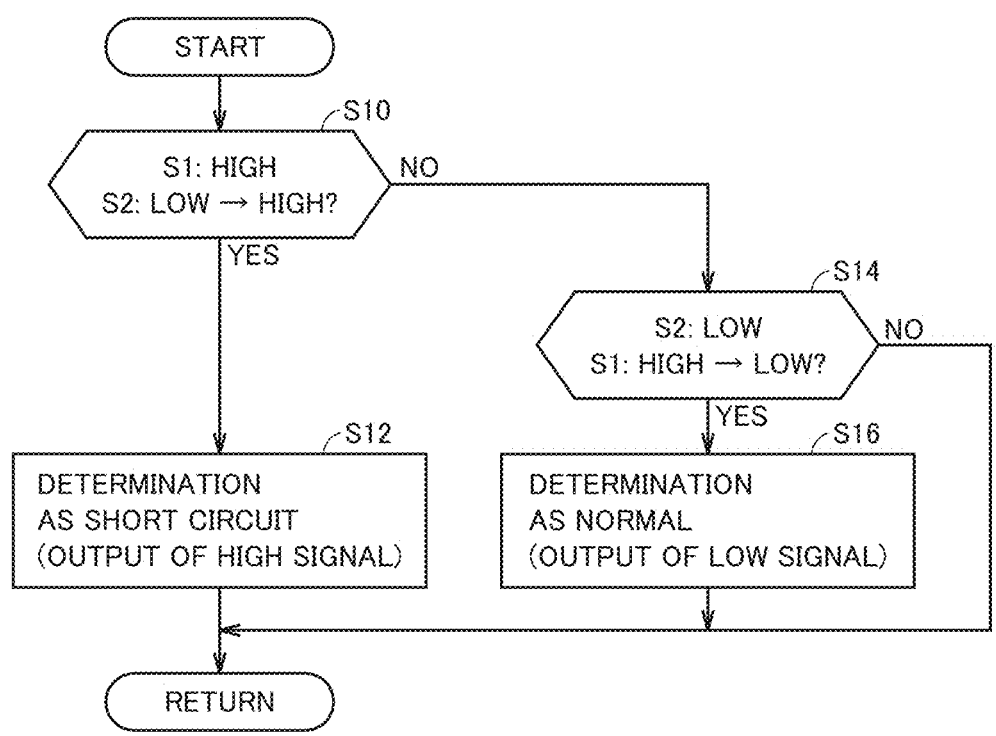
FIG. 3 is a flowchart showing an exemplary procedure of processing by a short-circuit determination unit.

FIG. 3 is a flowchart showing an exemplary procedure of processing performed when short-circuit determination unit 14 makes determination as to a short circuit of switching element 1. This flowchart is repeatedly performed each time a predetermined condition is satisfied (for example, every predetermined cycle) during the turn-on operation of switching element 1. Processing by short-circuit determination unit 14 may be implemented by software processing or processing by dedicated hardware (electronic circuitry).

Short-circuit determination unit 14 determines whether output signal S2 from second comparison device U2 has changed from the low state to the high state while output signal S1 from first comparison device U1 is in the high state (step S10).

When output signal S2 has changed from the low state to the high state while output signal S1 is in the high state (YES in step S10), that is, when the gate voltage reaches reference value VQR while the capacitor voltage is higher than reference value VQR, short-circuit determination unit 14 determines that switching element 1 is in the short-circuited state and outputs the high signal to instruction unit 2 (step S12).

When determination as NO is made in step S10, short-circuit determination unit 14 determines whether output signal S1 from first comparison device U1 has changed from the high state to the low state while output signal S2 from second comparison device U2 is in the low state (step S14).

When output signal S1 has changed from the high state to the low state while output signal S2 is in the low state (YES in step S14), that is, when the capacitor voltage has lowered from a value higher than reference value VQR to reference value VQR while the gate voltage is equal to or lower than reference value VR, short-circuit determination unit 14 determines that switching element 1 is in the normal state and has entered the Miller period and provides the low signal to instruction unit 2 (step S16).

When instruction unit 2 receives the high signal (the signal indicating that switching element 1 is in the short-circuited state) from short-circuit determination unit 14, it outputs the off-command described above (a command to turn on switching element 15, turn off switching element 5, and turn on switching element 6) to switching elements 5, 6, and 15. The short-circuited state of switching element 1 can thus be eliminated.

Furthermore, drive device 100 according to the present embodiment is designed such that capacitance Cb of capacitor 4 satisfies a relational expression (2) below:

$$|Voff - Von| \times Ci \geq |Vc - Von| \times Cb \qquad (2)$$

where "Ci" represents an input capacitance of switching element 1 (a total capacitance which is the sum of a capacitance between the gate and the source and a capacitance between the gate and the drain) and "Vc" represents a capacitor charging voltage (an initial value of the capacitor voltage). Negative bias potential Voff, drive voltage Von, and capacitance Cb of capacitor 4 are as described above.

The left side of the relational expression (2) corresponds to an amount of charges necessary for the gate voltage of switching element 1 to increase from negative bias potential Voff to drive voltage Von.

The right side of the relational expression (2) corresponds to an amount of charges discharged from capacitor 4 until the capacitor voltage lowers from initial value Vc to drive voltage Von.

If the relational expression (2) is not satisfied, the gate voltage is higher than drive voltage Von, which may shorten lifetime of a gate oxide layer in switching element 1.

In contrast, in the present embodiment, the relational expression (2) is satisfied. Thus, the capacitor voltage lowers to drive voltage Von during the switching operation of switching element 1 and diode 8 is rendered conducting. Therefore, the gate voltage in the steady on-state of switching element 1 can be stabilized at drive voltage Von (the output voltage from voltage source 7). Consequently, shorter lifetime of the gate oxide layer in switching element 1 can be suppressed.

As set forth above, drive device 100 according to the present first embodiment includes voltage source 3 (first voltage source), switching element 15, capacitor 4 connected in parallel to voltage source 3 with switching element 15 being interposed, switching elements 5 and 6 (switching devices) provided between capacitor 4 and the gate terminal of power switching element 1, first comparison device U1 to output signal S1 indicating a result of comparison between the voltage of capacitor 4 and reference value VQR, second comparison device U2 to output signal S2 indicating a result of comparison between the gate voltage of switching element 1 and reference value VR, and short-circuit determination unit 14 to determine whether switching element 1 is in the short-circuited state based on output signal S1 from first comparison device U1 and output signal S2 from second comparison device U2.

According to this configuration, determination as to the short-circuited state of switching element 1 is made based on the result of comparison between the voltage of capacitor 4 and reference value VQR (output signal S1 from first comparison device U1) and the result of comparison between the gate voltage of switching element 1 and reference value VR (output signal S2 from second comparison device U2). Therefore, an integrator is not required and the circuit can be simplified.

Second Embodiment

Figure 4:
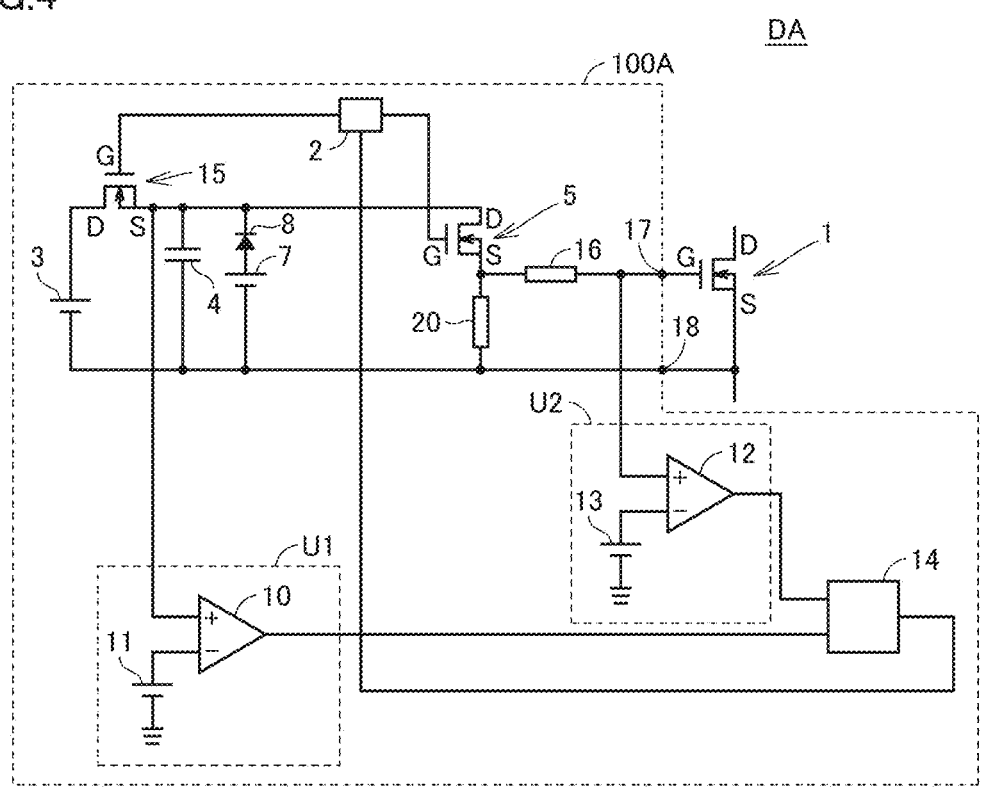
FIG. 4 is a diagram (No. 2) showing an exemplary semiconductor device.

FIG. 4 is a diagram showing an exemplary semiconductor device DA including a drive device 100A according to the present second embodiment. Drive device 100A shown in FIG. 4 is different from drive device 100 shown in FIG. 1 described above in that voltage source 9 to output negative bias potential Voff is not provided and switching element 6 is replaced with an off resistor 20. Since drive device 100A is otherwise the same in configuration as drive device 100 described above, detailed description will not be repeated.

In this drive device 100A, in turning off switching element 1, instruction unit 2 turns off switching element 5. A voltage across output terminals 17 and 18 of drive device 100A thus lowers to 0 V owing to gate resistor 16 and off resistor 20. Therefore, the gate voltage of switching element 1 becomes lower than the threshold voltage and switching element 1 is turned off.

Thus, drive device 100A simplified in configuration as compared with drive device 100 may be adopted.

Third Embodiment

In the first embodiment described above, an example in which determination as to the short circuit of switching element 1 is made based on relation between the amount of gate charges and the gate voltage of switching element 1 (see FIG. 2) is described.

In contrast, in the present third embodiment, determination as to the short circuit of switching element 1 is made based on relation between an amount of gate charges and a gate current of switching element 1.

Figure 5:
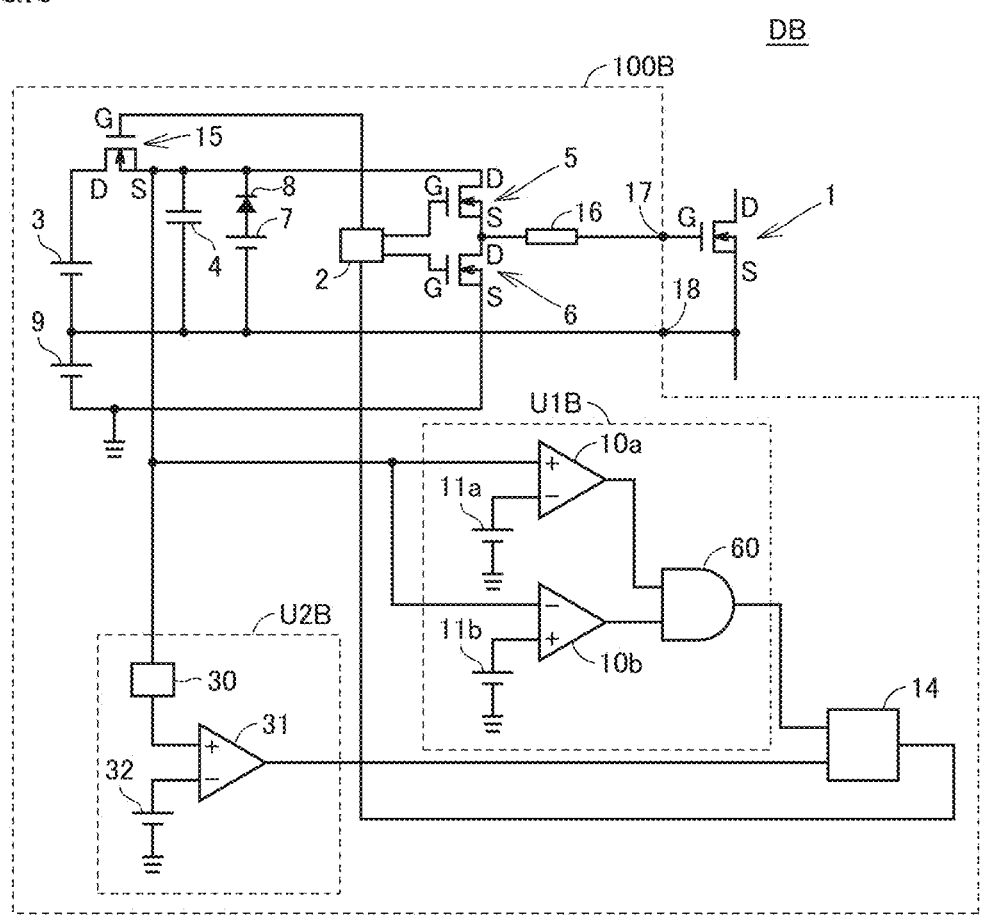
FIG. 5 is a diagram (No. 3) showing an exemplary semiconductor device.

FIG. 5 is a diagram showing an exemplary semiconductor device DB including a drive device 100B according to the present third embodiment. Drive device 100B shown in FIG. 5 is different from drive device 100 shown in FIG. 1 described above in replacement of first comparison device U1 and second comparison device U2 with a first comparison device U1B and a second comparison device U2B, respectively. Since drive device 100B is otherwise the same in configuration as drive device 100 described above, detailed description will not be repeated.

First comparison device U1B includes a comparison unit 10a and a voltage source 11a, a comparison unit 10b and a voltage source 11b, and a logic circuit 60. Voltage source 11a outputs a voltage corresponding to a reference value Vrq1 to comparison unit 10a. Comparison unit 10a outputs a result of comparison between the capacitor voltage and the voltage output from voltage source 11a to logic circuit 60. Voltage source 11b outputs a voltage corresponding to a reference value Vrq2 to comparison unit 10b. Comparison unit 10b outputs a result of comparison between the capacitor voltage and the voltage output from voltage source 11b to logic circuit 60. Logic circuit 60 can detect the amount of gate charges being within a range from reference value Vrq1 to reference value Vrq2 by AND of outputs from comparison units 10a and 10b. Logic circuit 60 outputs a result of detection to short-circuit determination unit 14.

Second comparison device U2B includes a differentiator 30, a comparison unit 31, and a voltage source 32. Differentiator 30 is provided between capacitor 4 and comparison unit 31 and outputs a value calculated by differentiation of the capacitor voltage to comparison unit 31. An output from differentiator 30 (a derivative value of the capacitor voltage) corresponds to a gate current of switching element 1 (a current that flows from drive device 100B to the gate of switching element 1). Voltage source 32 outputs a voltage corresponding to a reference value Vri to comparison unit 31. Comparison unit 31 can detect the gate current being lower than reference value Vri by comparing the output from differentiator 30 (a value corresponding to the gate current) with the voltage output from voltage source 32. Comparison unit 31 outputs a result of comparison to short-circuit determination unit 14.

In drive device 100B shown in FIG. 5 as well, the short circuit of switching element 1 can be detected without the use of an integrator and a design flexibility is improved.

Figure 6:
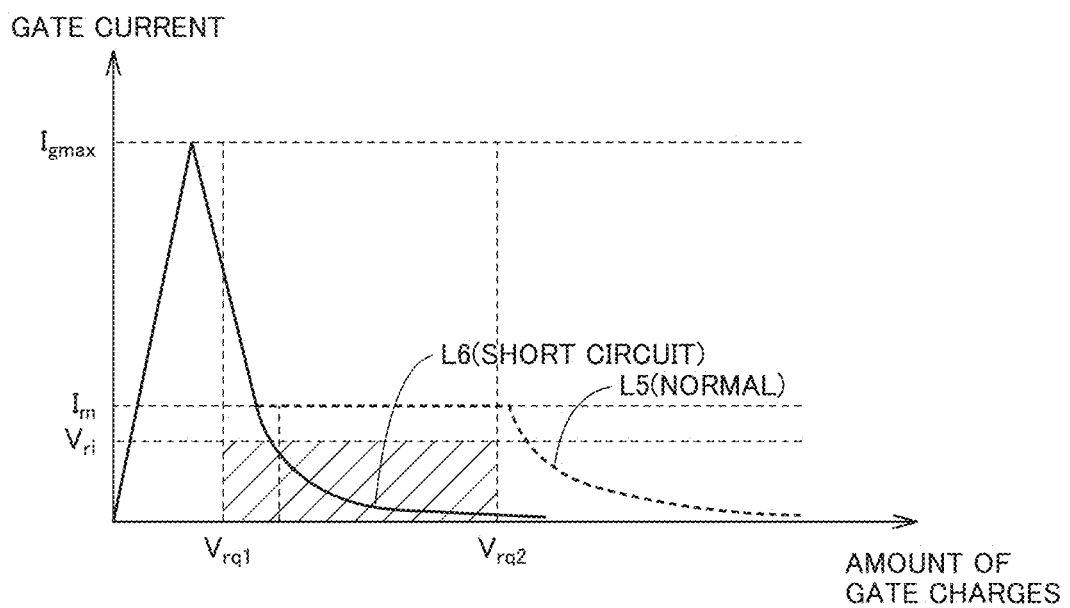
FIG. 6 is a diagram showing exemplary relation between an amount of gate charges and a gate current.

FIG. 6 is a diagram showing exemplary relation between the amount of gate charges and the gate current in the turn-on operation of switching element 1. FIG. 6 shows relation in the normal state of switching element 1 with a dashed line L5 and shows relation in the arm short circuit of switching element 1 with a solid line L6.

In the normal state, owing to presence of the Miller period described above, a period for which a rate of variation in gate current is very slow (a period for which the gate current is almost constant at a current of Im) as shown with dashed line L5 exists. In the arm short circuit, on the other hand, there is no Miller period and the gate current monotonically lowers as shown with solid line L6.

Determination as to the short circuit of switching element 1 can be made by setting output voltages from voltage sources 11a, 11b, and 32 such that an area surrounded by reference value Vri of the gate current and reference values Vrq1 and Vrq2 of the amount of gate charges corresponds to a hatched portion shown in FIG. 6 to enable determination of a difference between dashed line L5 and solid line L6.

As set forth above, in drive device 100B shown in FIG. 5, a value of the gate current can be calculated by differentiating the capacitor voltage, and determination as to the short circuit of switching element 1 can be made based on the gate current. Therefore, in drive device 100B as well, determination as to the short circuit of switching element 1 can be made without the use of an integrator.

Fourth Embodiment

Figure 7:
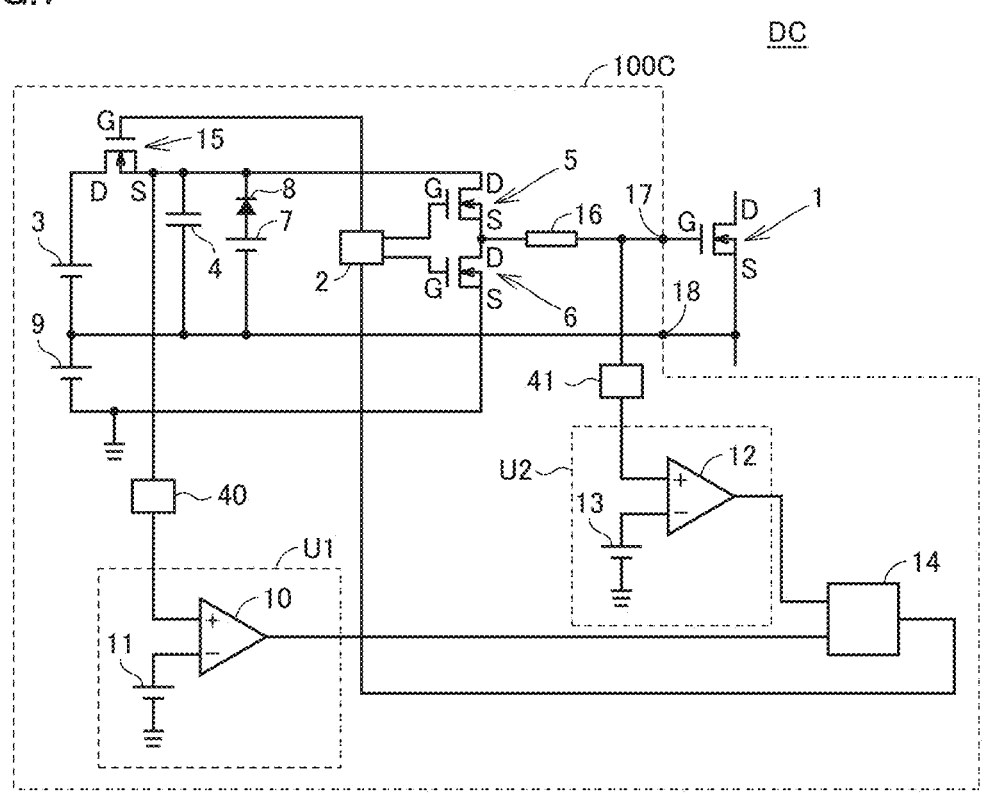
FIG. 7 is a diagram (No. 4) showing an exemplary semiconductor device.

FIG. 7 is a diagram showing an exemplary semiconductor device DC including a drive device 100C according to the present fourth embodiment. Drive device 100C shown in FIG. 7 is different from drive device 100 shown in FIG. 1 described above in addition of filters 40 and 41 to respective input portions of comparison units 10 and 12. Since drive device 100C is otherwise the same in configuration as drive device 100 described above, detailed description will not be repeated.

Comparison units 10 and 12 may malfunction due to noise such as radiation noise from the outside of the circuit. Therefore, by inserting filters 40 and 41 in the respective input portions of comparison units 10 and 12, a configuration less likely to suffer from a malfunction can be achieved.

Though FIG. 7 shows a modification of drive device 100 shown in FIG. 1, a similar effect can be obtained by inserting a filter in an input portion of the comparison unit or the differentiator in another drive device 100A or 100B.

Fifth Embodiment

In each of the first to fourth embodiments described above, the short-circuited state of switching element 1 is detected based on determination as to whether there exists a Miller period.

In contrast, in the present fifth embodiment, when the Miller period is detected, an output voltage from drive device 100 is lowered to prevent a switching speed of switching element 1 from becoming higher than necessary and to lower a rate of change over time of a drain voltage.

Figure 8:
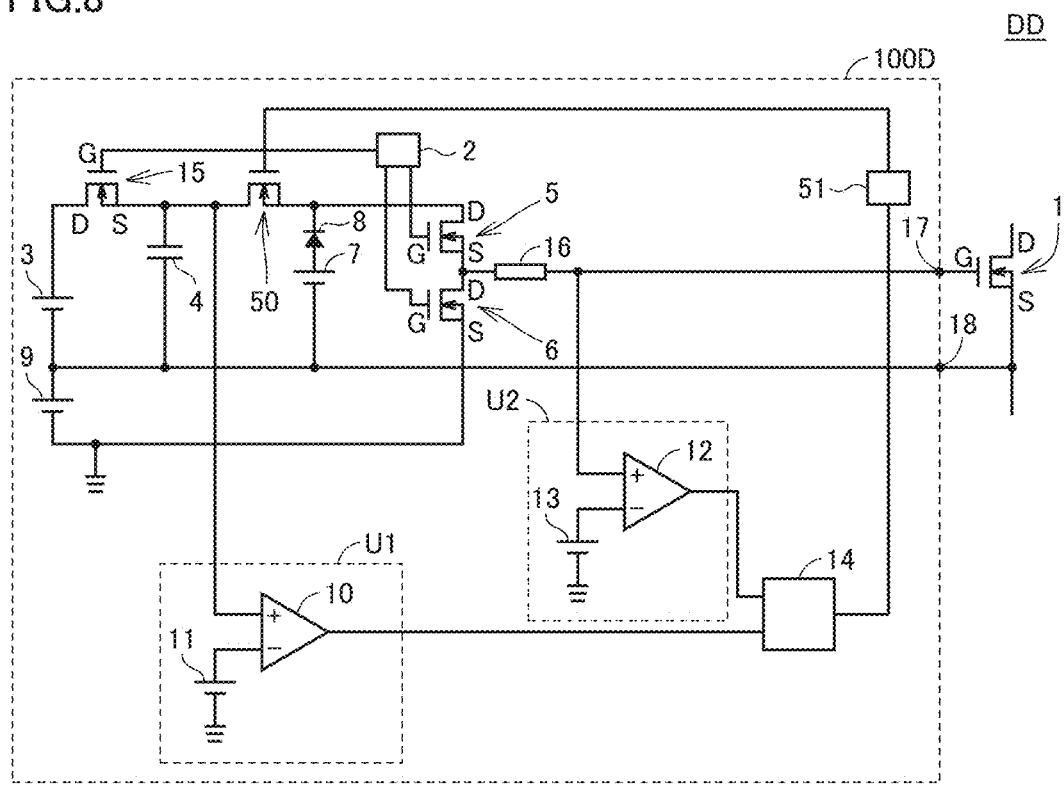
FIG. 8 is a diagram (No. 5) showing an exemplary semiconductor device.

FIG. 8 is a diagram showing an exemplary semiconductor device DD including a drive device 100D according to the present fifth embodiment. Drive device 100D shown in FIG. 8 is different from drive device 100 shown in FIG. 1 described above in that a switching element 50 and a control unit 51 are added and an output from short-circuit determination unit 14 is provided to control unit 51. Since drive device 100D is otherwise the same in configuration as drive device 100 described above, detailed description will not be repeated.

Capacitor 4 is connected to switching element 5 with switching element 50 implemented by a MOSFET being interposed. When control unit 51 receives a low signal from short-circuit determination unit 14 (that is, beginning of the Miller period is detected), it turns off switching element 50 to cut off supply of charges from capacitor 4 to switching element 5. Thus, when beginning of the Miller period is detected, an output voltage from drive device 100D is switched to drive voltage Von output from voltage source 7. Therefore, the subsequent switching speed of switching element 1 can be suppressed and a rate of change (an amount of change per unit time) of a voltage across main terminal of switching element 1 which is a cause of noise can be suppressed.

Figure 9:
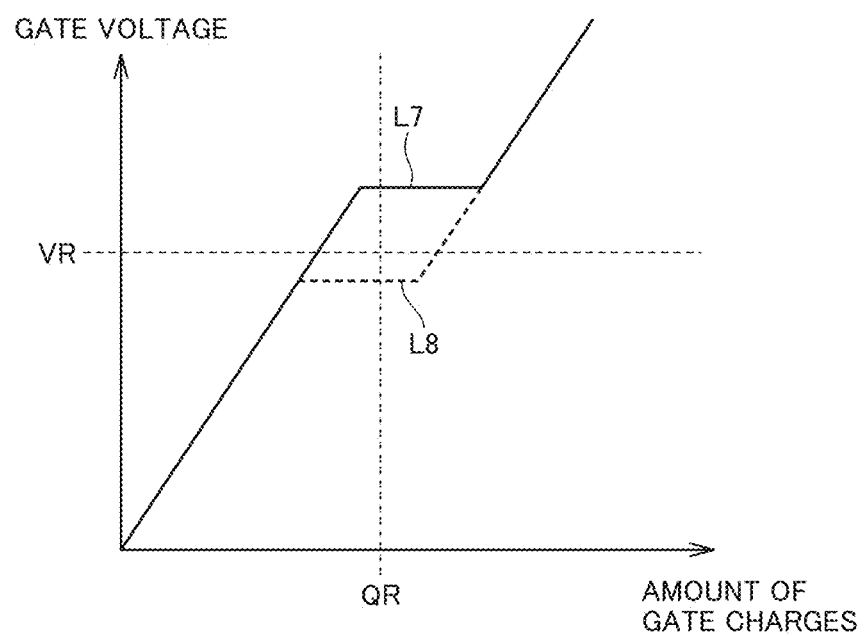
FIG. 9 is a diagram (No. 1) showing exemplary relation between an amount of gate charges and a gate voltage.

FIG. 9 is a diagram showing exemplary relation between the amount of gate charges and the gate voltage of switching element 1 in the turn-on operation of switching element 1. FIG. 9 shows with a solid line L7, relation in switching of a current value at which a Miller voltage is higher than reference value VR and shows with a dashed line L8, relation in switching of a current value at which a Miller voltage is lower than reference value VR.

When the current value at which the Miller voltage is higher than reference value VR is switched, as shown with solid line L7, there is no region where the gate voltage is lower than reference value VR and the amount of gate charges is higher than reference value QR, and hence the switching speed does not lower and turn-on loss does not increase.

When the current value at which the Miller voltage is lower than reference value VR is switched, as shown with dashed line L8, there is a region where the gate voltage is lower than reference value VR and the amount of gate charges is higher than reference value QR. When this region is detected, short-circuit determination unit 14 makes determination as beginning of the Miller period and outputs the low signal to control unit 51. Thus, the output voltage from drive device 100D lowers from the voltage across capacitor 4 to drive voltage Von of voltage source 7, and hence the rate of change (the amount of change per unit time) of the voltage across main terminal of switching element 1 can be suppressed.

Sixth Embodiment

Figure 10:
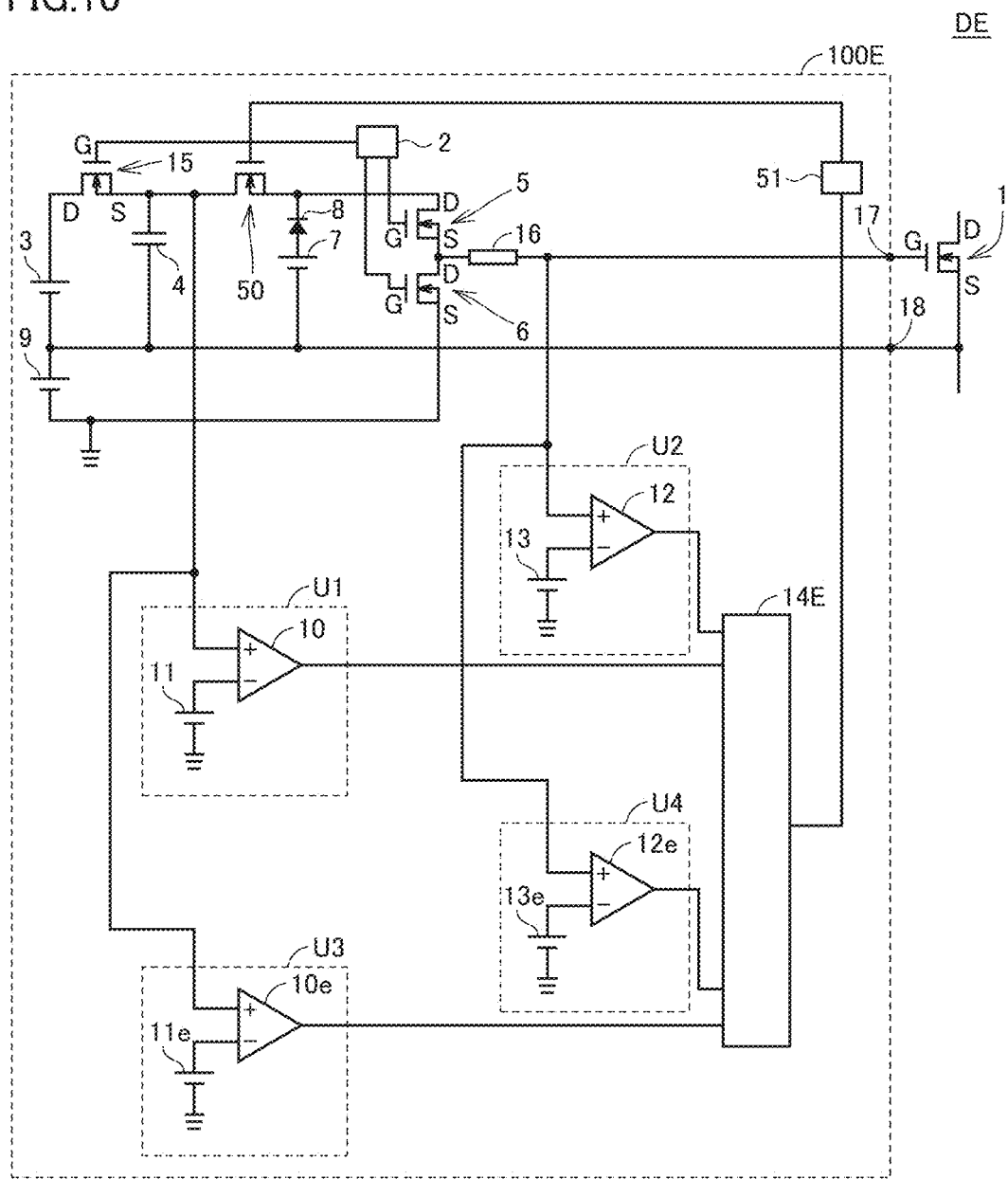
FIG. 10 is a diagram (No. 6) showing an exemplary semiconductor device.

FIG. 10 is a diagram showing an exemplary semiconductor device DE including a drive device 100E according to the present sixth embodiment, Drive device 100E shown in FIG. 10 is different from drive device 100D shown in FIG. 8 described above in addition of a third comparison device U3 and a fourth comparison device U4 and replacement of short-circuit determination unit 14 with a short-circuit determination unit 14E. Since drive device 100E is otherwise the same in configuration as drive device 100 described above, detailed description will not be repeated.

In the fifth embodiment described above, in switching in which a Miller current is lower than reference value VR, short-circuit determination unit 14 outputs the high signal after the end of the Miller period, which may result in occurrence of a condition that suppression of the rate of change of the voltage across main terminal of switching element 1 is insufficient.

Figure 11:
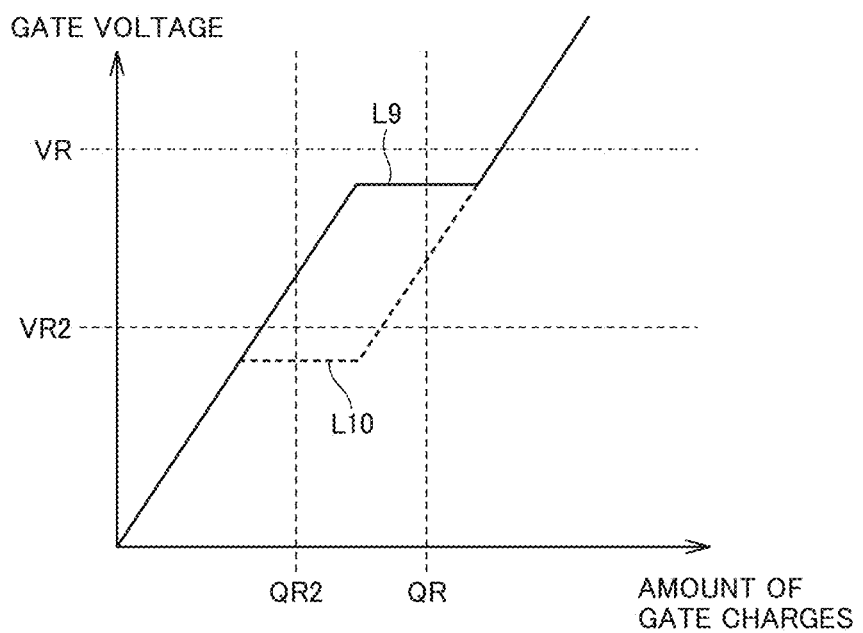
FIG. 11 is a diagram (No. 2) showing exemplary relation between an amount of gate charges and a gate voltage.

FIG. 11 is a diagram showing exemplary relation between the amount of gate charges and the gate voltage of switching element 1 in the turn-on operation of switching element 1. FIG. 11 shows with a solid line L9, relation in switching of a current value at which a Miller voltage is lower than reference value VR and higher than a reference value VR2 and shows with a dashed line L10, relation in switching of a current value at which a Miller voltage is lower than reference values VR and VR2.

In an example shown in FIG. 11, when determination as to the Miller period is made based on reference value QR of the amount of gate charges and reference value VR of the gate voltage, in a waveform shown with dashed line L10 where the current is low, timing when the gate voltage becomes lower than reference value VR and the amount of gate charges becomes higher than reference value QR (that is, timing of detection of the Miller period) comes later than the end of the Miller period.

Then, in the present sixth embodiment, in addition to first comparison device U1 and second comparison device U2, third comparison device U3 and fourth comparison device U4 are provided.

Third comparison device U3 includes a comparison unit 10e and a voltage source 11e. Voltage source 11e outputs a reference value different from reference value VQR (a value of the gate voltage at the time when the amount of gate charges is a value QR2 lower than reference value QR) to comparison unit 10e. Comparison unit 10e outputs a signal S3 indicating a result of comparison between the capacitor voltage and the voltage outputted from voltage source 11 to short-circuit determination unit 14E.

Fourth comparison device U4 includes a comparison unit 12e and a voltage source 13e. Voltage source 13e outputs a voltage at reference value VR2 lower than reference value VR to comparison unit 12e. Comparison unit 12e outputs a signal S4 indicating a result of comparison between the gate voltage of switching element 1 and a voltage output from voltage source 13e to short-circuit determination unit 14E.

Short-circuit determination unit 14E detects the Miller period of switching element 1 based on output signal S1 from first comparison device U1, output signal 82 from second comparison device U2, output signal S3 from third comparison device U3, and output signal S4 from fourth comparison device U4.

When short-circuit determination unit 14E detects the Miller period of switching element 1, control unit 51 turns off switching element 50.

Thus, in the sixth embodiment, third comparison device U3 and fourth comparison device U4 are additionally provided, so that the Miller period can appropriately be detected also under a condition different in magnitude of the current and an output voltage from drive device 100D can be lowered. Therefore, the rate of change (the amount of change per unit time) of the voltage across main terminal of switching element 1 can appropriately be suppressed also under the condition different in magnitude of the current.

Seventh Embodiment

The present embodiment is application of any one of semiconductor devices D to DE according to the first to sixth embodiments described above to a power conversion device. An example of the application of the present disclosure to a three-phase inverter will be described below as a seventh embodiment.

Figure 12:
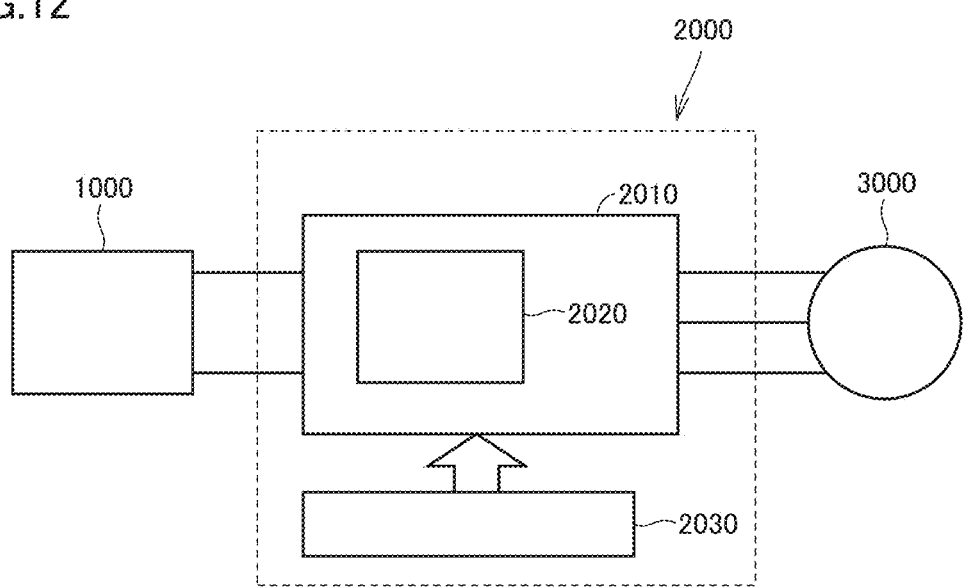
FIG. 12 is a block diagram showing a configuration of a power conversion system.

FIG. 12 is a block diagram showing a configuration of a power conversion system to which the power conversion device according to the present seventh embodiment is applied.

The power conversion system shown in FIG. 12 includes a power supply 1000, a power conversion device 2000, and a load 3000. Power supply 1000 is a DC power supply and supplies DC power to power conversion device 2000. Power supply 1000 can be implemented by various devices such as a DC system, a photovoltaic cell, or a storage battery, or by a rectification circuit or an AC/DC converter connected to an alternating-current (AC) system. Power supply 1000 may be implemented by a DC/DC converter that converts DC power outputted from the DC system to electric power that load 3000 can use.

Power conversion device 2000 is a three-phase inverter connected between power supply 1000 and load 3000, and it converts DC power supplied from power supply 1000 into AC power and supplies AC power to load 3000. As shown in FIG. 12, power conversion device 2000 includes a main conversion circuit 2010 to convert DC power into AC power and output AC power and a control circuit 2030 to output a control signal for controlling main conversion circuit 2010 to main conversion circuit 2010.

Load 3000 is a three-phase motor driven by AC power supplied from power conversion device 2000. Load 3000 is a motor mounted on various electrical appliances and used, for example, as a motor for a hybrid vehicle, an electric vehicle, a rolling stock, an elevator, or an air-conditioner.

Details of power conversion device 2000 will be described below. Main conversion circuit 2010 includes a switching element (not shown). As the switching element switches, DC power supplied from power supply 1000 is converted into AC power, which is supplied to load 3000. Though a specific circuit configuration of main conversion circuit 2010 is various, main conversion circuit 2010 according to the present embodiment is a two-level three-phase full bridge circuit and may be constituted of six switching elements and six freewheeling diodes in anti-parallel to respective switching elements. Main conversion circuit 2010 includes a semiconductor device 2020 including each switching element and a drive device to drive each switching element. Each switching element and each drive device provided in semiconductor device 2020 are switching element 1 and the drive device included in any of semiconductor devices D to DE according to the first to sixth embodiments described above. Every two switching elements of the six switching elements are connected in series to implement upper and lower arms, and the upper and lower arms implement phases (the U phase, the V phase, and the W phase) of the full bridge circuit. Output terminals of the upper and lower arms, that is, three output terminals of main conversion circuit 2010, are connected to load 3000.

Control circuit 2030 controls the switching element of main conversion circuit 2010 such that desired electric power is supplied to load 3000. Specifically, a time period (an on time period) during which each switching element of main conversion circuit 2010 should be on is calculated based on electric power to be supplied to load 3000. For example, main conversion circuit 2010 can be controlled under PWM control in which an on time period of the switching element is modulated in accordance with a voltage to be output. Then, a control command (a control signal) is output to a drive circuit provided in main conversion circuit 2010 such that an on signal is output to the switching element to be turned on and an off signal is output to the switching element to be turned off at each time point. The drive circuit outputs the on signal or the off signal as the drive signal to a control electrode of each switching element, in accordance with the control signal.

Since the semiconductor device according to any of the first to sixth embodiments is applied as semiconductor device 2020 included in main conversion circuit 2010 in the power conversion device according to the present seventh embodiment, as in the first to sixth embodiments, the short-circuited state of the power switching element can be detected with a simplified circuit without the use of an integrator.

Though an example in which the present disclosure is applied to a two-level three-phase inverter is described in the present seventh embodiment, the present disclosure can be applied to various power conversion devices without being limited as such. Though a two-level power conversion device is adopted in the present seventh embodiment, a three-level power conversion device or a multilevel power conversion device may be applicable. In supply of electric power to a single-phase load, the present disclosure may be applied to a single-phase inverter. In supply of electric power to a DC load, the present disclosure can also be applied to a DC/DC converter or an AC/DC converter.

The power conversion device to which the present disclosure is applied is not limited to an above-described example in which a motor is adopted as the load, and the power conversion device can also be employed, for example, in a power supply apparatus of an electric discharge machining apparatus or a laser processing machine or a power supply apparatus of an induction heating cooker or a wireless power transfer system. The power conversion device to which the present disclosure is applied can also further be used as a power conditioner of a photovoltaic power generation system or a power storage system.

It should be understood that the embodiments disclosed herein are illustrative and non-restrictive in every respect. The scope of the present disclosure is defined by the terms of the claims rather than the description above and is intended to include any modifications within the scope and meaning equivalent to the terms of the claims.

REFERENCE SIGNS LIST 1, 5, 6, 15, 50 switching element; 2 instruction unit; 3, 7, 9, 11, 11a, 11b, 11e, 13, 13e, 32 voltage source; 4 capacitor; 8 diode; 10, 10a, 10b, 10e, 12, 12e, 31 comparison unit; 14, 14E short-circuit determination unit; 16 gate resistor; 17, 18 output terminal; 20 off resistor; 30 differentiator; 40, 41 filter; 51 control unit; 60 logic circuit; 100, 100A, 100B, 100C, 100D, 100E drive device; 1000 power supply; 2000 power conversion device; 2010 main conversion circuit; 2020, D, DA, DB, DC, DD, DE semiconductor device; 2030 control circuit; 3000 load; U1, U1B first comparison device; U2, U2B second comparison device; U3 third comparison device; U4 fourth comparison device

The invention claimed is:

1. A drive device to drive a power semiconductor element including a gate terminal, the drive device comprising:
 a first voltage source;
 a switching element having a drain connected to the first voltage source;
 a capacitor connected to a source of the switching element;
 a switching device provided between the capacitor and the gate terminal of the power semiconductor element and configured to switch a voltage applied to the gate terminal;
 a first comparison device to output a signal indicating a result of comparison between a voltage of the capacitor and a first reference value;
 a second comparison device to output a signal indicating a result of comparison between a voltage or a derivative value of the voltage at the gate terminal and a second reference value; and
 a determination unit to determine whether the power semiconductor element is in a short-circuited state based on an output signal from the first comparison device and an output signal from the second comparison device.

2. The drive device to drive the power semiconductor element according to claim 1, wherein
 the first comparison device
 outputs a signal indicating a low state when the voltage of the capacitor is equal to or lower than the first reference value, and
 outputs a signal indicating a high state when the voltage of the capacitor is higher than the first reference value, the second comparison device
 outputs a signal indicating the low state when the voltage or the derivative value of the voltage at the gate terminal is equal to or lower than the second reference value, and
 outputs a signal indicating the high state when the voltage or the derivative value of the voltage at the gate terminal is higher than the second reference value, and
 the determination unit
 determines that the power semiconductor element is in the short-circuited state when the output signal from the second comparison device changes from the low state to the high state while the output signal from the first comparison device is in the high state, and
 determines that the power semiconductor element is not in the short-circuited state when the output signal from the first comparison device changes from the high state to the low state while the output signal from the second comparison device is in the low state.

3. The drive device to drive the power semiconductor element according to claim 1, further comprising a second voltage source connected between a negative side of the first voltage source and ground, wherein
 the switching device is connected in parallel to the first voltage source and the second voltage source and configured to switch the voltage applied to the gate terminal between a positive voltage from the first voltage source or the capacitor and a negative voltage from the second voltage source.

4. The drive device to drive the power semiconductor element according to claim 1, further comprising:
 an output terminal connectable to the power semiconductor element;
 a disconnection device provided between the capacitor and the output terminal, the disconnection device operating to disconnect the capacitor and the output terminal from each other in accordance with an output from the determination unit; and
 a stabilization voltage source connected in parallel to the capacitor with the disconnection device and a diode being interposed and connected to the output terminal with the diode being interposed, the stabilization voltage source outputting a voltage lower than the voltage of the capacitor.

5. The drive device to drive the power semiconductor element according to claim 4, further comprising:
 a third comparison device to output a signal indicating a result of comparison between the voltage of the capacitor and a reference value different from the first reference value; and
 a fourth comparison device to output a signal indicating a result of comparison between the voltage or the derivative value of the voltage at the gate terminal and a reference value different from the second reference value, wherein
 the determination unit detects a Miller period of the power semiconductor element based on the output signal from the first comparison device, the output signal from the second comparison device, an output signal from the third comparison device, and an output signal from the fourth comparison device, and
 the disconnection device operates to disconnect the capacitor and the output terminal from each other in response to detection of the Miller period by the determination unit.

6. The drive device to drive the power semiconductor element according to claim 1, wherein
 the second comparison device includes
 a differentiator to output a derivative value of the voltage of the capacitor, and
 a comparator to compare an output from the differentiator and the second reference value with each other.

7. The drive device to drive the power semiconductor element according to claim 1, wherein
a capacitance Cb of the capacitor satisfies a relational expression $$Cb \leq \{|Voff-Von|/|Vc-Von| \times Ci\}$$

where Von represents the voltage of the gate terminal when the power semiconductor element is turned on, Voff represents the voltage of the gate terminal when the power semiconductor element is turned off, Ci represents an input capacitance of the power semiconductor element, Vc represents a charging voltage of the capacitor, and Cb represents a capacitance of the capacitor.

8. The drive device to drive the power semiconductor element according to claim 1, wherein
the power semiconductor element is composed of any of silicon, silicon carbide, gallium nitride, and gallium oxide.

9. A semiconductor device comprising:
the drive device and the power semiconductor element according to claim 1.

10. A power conversion device comprising:
a main conversion circuit including the drive device and the power semiconductor element according to claim 1, the main conversion circuit converting input electric power and outputting resultant electric power; and
a control circuit to output a control signal for controlling the main conversion circuit to the main conversion circuit.

* * * * *